United States Patent [19]

Lee

[11] Patent Number: 5,896,395
[45] Date of Patent: Apr. 20, 1999

[54] INTEGRATED CIRCUIT MEMORY DEVICES AND OPERATING METHODS INCLUDING TEMPORARY DATA PATH WIDTH OVERRIDE

[75] Inventor: Si-yeol Lee, Kyungki-do, Rep. of Korea

[73] Assignee: Samsung Electronics Co., Ltd., Suwon, Rep. of Korea

[21] Appl. No.: 08/772,893

[22] Filed: Dec. 24, 1996

[30] Foreign Application Priority Data

Dec. 30, 1995 [KR] Rep. of Korea .................. 95-69726

[51] Int. Cl.$^6$ .................................................. G11C 29/00
[52] U.S. Cl. ............................................................ 371/21.1
[58] Field of Search ............................................. 371/21.1

[56] References Cited

U.S. PATENT DOCUMENTS 5,070,445 12/1991 Woodward ............................. 395/500

OTHER PUBLICATIONS

A book on "CMOS DRAMS with Model Nos. KM44C4004A, KM44C04104A, KM44V004A and KM44V4104A", Samsung Electronics Co., Ltd. pp. 46–47, 1995.

A book on "CMOS DRAM with Model Nos. KM416C1004A, KM416C1204A, KM416V1004A, KM416V1024A" Samsung Electronics Co., Ltd., 1995, pp. 62–63.

*Primary Examiner*—Phung M. Chung
*Attorney, Agent, or Firm*—Myers Bigel Sibley & Sajovec

[57] ABSTRACT

An integrated circuit memory device includes an array of memory cells having a selectable first or second data path width. The integrated circuit memory device also includes a circuit which permanently selects one of the first and second data path widths for permanent operation of the integrated circuit memory device, and which temporarily overrides the permanent selection, to thereby temporarily operate the integrated circuit memory device using the other data path width. Accordingly, for example, when the first path width is a 16 bit path width and the second path width is a 4 bit path width, the path width is permanently selected during manufacturing of the integrated circuit memory device, to thereby manufacture 16 bit path width or 4 bit path width devices. However, during testing, the 16 bit path width devices may be temporarily overridden and tested as 4 bit path width devices. The number of test pins which are required can therefore be reduced and testing efficiency can be improved.

18 Claims, 5 Drawing Sheets

INTEGRATED CIRCUIT MEMORY DEVICES AND OPERATING METHODS INCLUDING TEMPORARY DATA PATH WIDTH OVERRIDE

FIELD OF THE INVENTION

This invention relates to integrated circuit memory devices and operating methods, and more particularly to integrated circuit devices having data path widths which are selectable, and methods of operating same.

BACKGROUND OF THE INVENTION

Integrated circuit memory devices are widely used in consumer and commercial applications to store data. As is well known to those having skill in the art, integrated circuit memory devices generally include an array of memory cells. In order to increase manufacturing efficiencies, integrated circuit memory devices typically include an array of memory cells which has a selectable path width. As is well known to those having skill in the art, the path width, which reflects the number of data input/output channels, also referred to as "DQ" channels, can vary for a given size of memory. Thus, for example, a 16 megabit dynamic RAM (DRAM) array may be configured during manufacture to operate with a 4 bit data path width, so that a 4 megabit×4 DRAM is provided. Alternatively, the 16 megabit DRAM may be configured to operate as a 1 megabit×16 DRAM, so that a 16 bit wide data path is provided.

In one illustrative example, Samsung Electronics Co., Ltd., the assignee of the present invention, markets a family of 16 megabit CMOS DRAMs, as 4 megabit×4 bit DRAMs and 1 megabit×16 bit DRAMs. In particular, Model Nos. KM44C4004A, KM44C04104A, KM44V004A and KM44V4104A are marketed as 4 megabit×4 bit DRAMs. See Samsung Electronics 1995 Databook, Pages 46–47. Models KM416C1004A, KM416C1204A, KM416V1004A and KM416V1204A are marketed as 1 megabit×16 bit CMOS DRAMs. See Pages 62–63 of the aforesaid 1995 Databook. An integrated circuit memory in which 16 bits of data is simultaneously read from and written to a memory device via 16 DQ channels is referred to as operating in "×16" mode. Similarly, an integrated circuit memory device in which 4 data bits are simultaneously read from and written to a memory device via 4 DQ channels is referred to as operating in "×4" mode.

Figure 1A:
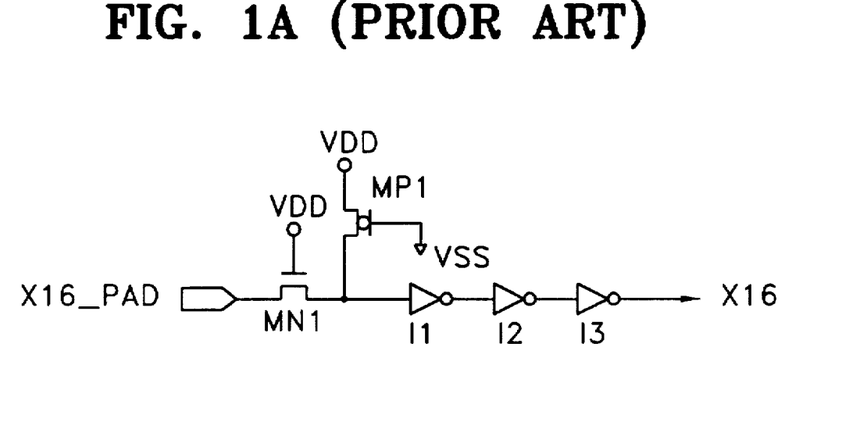
FIG. 1A is a circuit diagram of a conventional x16 mode selection signal generator.
Figure 1B:
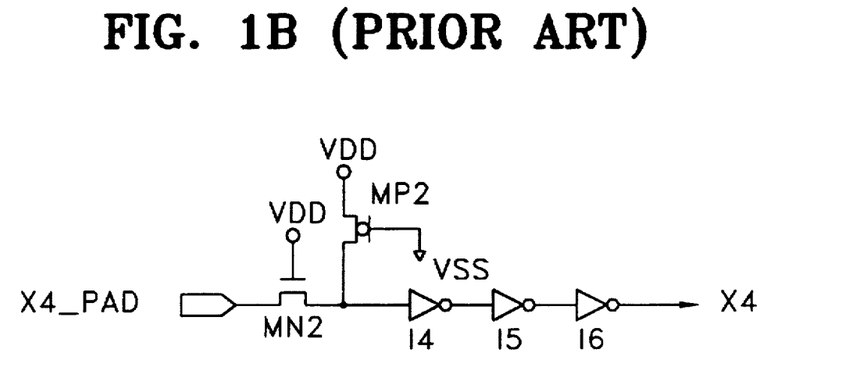
FIG. 1B is a circuit diagram of a conventional x4 mode selection signal generator.

Integrated circuit memory devices may be designed and manufactured to include both the ×16 and the ×4 mode in a single integrated circuit. During manufacturing, either ×16 mode or ×4 mode is selected to produce, for example, a 4 megabit by 4 bit DRAM or a 1 megabit×16 bit DRAM. Selection of the mode is generally performed by generating permanent selection signals during manufacturing. In particular, an ×16 bonding pad and an ×4 bonding pad are provided in the integrated circuit. One of the bonding pads is tied to ground or power supply voltage to permanently produce either an ×16 or an ×4 signal. FIGS. 1A and 1B are circuit diagrams of a conventional ×16 mode selection signal generator and an ×4 mode selection signal generator, respectively.

Referring now to FIG. 1A, the ×16 mode selection signal generator includes an ×16 bonding pad which receives a bonding signal, such as a permanently bonded power supply voltage, ground or other permanent signal. A transfer transistor MN1 transfers the bonding signal. Inverters I1, I2 and I3 serially invert the transferred bonding signal. A pull-up transistor MP1 is always turned on and is connected to the output terminal of the transfer transistor MN1.

Similarly, in FIG. 1B, the ×4 mode selection signal generator includes an ×4 bonding pad which receives a bonding signal and a transfer transistor MN2 which transfers the bonding signal. Inverters I4, I5 and I6 serially invert the transferred bonding signal, and a pull-up transistor MP2 is connected to the output terminal of the transfer transistor MN2.

Accordingly, if the ×16 bonding pad of FIG. 1A is permanently connected to ground voltage VSS, the output signal ×16 is always set to the power supply voltage VDD. The signal ×16 is then applied to the array of memory cells so that the integrated circuit memory device always operates in ×16 mode. Alternatively, if the ×4 bonding pad of FIG. 1B is bonded to VSS, the output signal ×4 of FIG. 1B is maintained at high level VDD and the integrated circuit memory device will operate in ×4 mode.

As stated above, during manufacture, the integrated circuit memory device is set for either ×16 mode or ×4 mode and is identified, marketed and operated accordingly.

SUMMARY OF THE INVENTION

The present invention includes integrated circuit memory devices and methods of operating same, wherein the data path width for the integrated circuit memory device can be temporarily overridden. The invention stems from the realization that it may often be desirable to temporarily override the permanent data path width in order to accomplish specific purposes. For example, in testing a memory device, multiple memory devices are generally tested by test equipment simultaneously. The test equipment generally includes a fixed number of DQ channels and test pins for reading data from and writing data into integrated circuit memory devices which are being tested. Thus, when the integrated circuit memory device has a large data path width, the number of integrated circuit memory devices which can be tested simultaneously may be reduced.

For example, when ×16 mode and ×4 mode memory devices are being tested, the testing efficiency is lowered for the ×16 mode devices because they occupy four times as many channels in the tester compared to the ×4 devices. Accordingly, the present invention has realized that it is desirable to provide a circuit which temporarily overrides the ×16 mode of the memory during testing to allow the ×16 mode memory to be tested as an ×4 mode memory. After testing, the permanent ×16 mode of the memory continues. Thus, more memory devices can be simultaneously tested by temporarily reducing the number of DQ channels during testing.

In particular, integrated circuit memory devices according to the invention include an array of memory cells having a selectable one of first and second data path widths. A circuit is also included which permanently selects one of the first and second data path widths for permanent operation of the integrated circuit memory device. The circuit also temporarily overrides the permanent selection of the one of the first and second data path widths, to thereby temporarily operate the memory using the other of the first and second data path widths.

Preferably, the circuit is activated during manufacture of the integrated circuit memory device to permanently select one of the first and second data path widths for operation of the integrated circuit memory device. The circuit is also activated during testing of the integrated circuit memory device, to allow testing of the integrated circuit memory device using the other of the first and second data path widths.

Thus, for example, when the first path width is a 16 bit path width and the second path width is a 4 bit path width, the circuit may be activated to permanently select the 16 bit path width for operation of the integrated circuit memory device to produce x16 mode devices. However, the 16 bit path width is temporarily overridden to operate the memory with a 4 bit path width, for example for testing efficiency.

The circuit which permanently selects and temporarily overrides may include a mode register, a first data path width selection signal generator and a second data path width selection signal generator. The mode register generates a mode control signal in response to an input signal. The input signal may be applied during testing. The first data path width selection signal generator is responsive to a permanent first data path selection signal, for example permanent application of power supply voltage, ground voltage or another voltage, to a first data path pad, to permanently select the first data path width. However, the first data path width selection signal generator is also responsive to the temporary override signal, to temporarily override selection of the first data path width.

Similarly, a second data path width signal generator is responsive to a permanent second data path selection signal, to permanently select the second data path width. The second data path width selection signal generator is also responsive to the temporary override signal, to temporarily override selection of the second data path width.

In one embodiment, the input mode register includes a first transfer circuit which transfers the input signal in response to a control signal. A latch stores the transferred input signal and a first logic circuit generates the mode control signal from the transferred input signal.

An embodiment of the first data path width selection signal generator comprises a first integrated circuit bonding pad and a second transfer circuit which transfers a permanent first data path width selection signal which is received from the first bonding pad. A second logic circuit combines the transferred first bonding signal and the mode control signal to permanently select the first data path width in response to the permanent first data path width selection signal unless the mode control signal temporarily overrides the permanent first data path width selection signal.

Similarly, the second data path width selection signal generator includes a second integrated circuit bonding pad and a third transfer circuit which transfers a permanent second data path width selection signal which is received from the second bonding pad. A third logic circuit combines the transferred second bonding signal and the mode control signal to permanently select the second data path width in response to the permanent first data path width selection signal unless the mode control signal temporarily overrides the permanent second path width selection signal.

In another aspect of the present invention, a fuse circuit including at least one fuse is also included in the integrated circuit memory device. The mode register generates the mode control signal in response to the input signal and in response to the state of the at least one fuse. An embodiment of the fuse circuit includes a first fuse signal generator which generates a first fuse signal in response to the state of a first fuse and a second fuse signal generator which generates a second fuse signal in response to the state of a second fuse. A logic circuit inverts the first fuse signal and logically combines the inverted first fuse signal and the second fuse signal to produce a fuse controlling signal. Thus, during testing, at least one of the fuses can be activated to produce the override signal for the permanent data path width.

Accordingly, integrated circuit memory devices including an array of memory cells having a selectable one of first and second data path widths are operated, by permanently selecting one of the first and second data path widths for permanent operation of the integrated circuit memory device. The permanent selection is temporarily overridden, to thereby temporarily operate the memory using the other of the first and second data path widths. The permanently selecting step is preferably performed during manufacture of the integrated circuit memory device to permanently select one of the first and second data path widths for operation. The temporary overriding step is preferably performed during testing of the integrated circuit memory device to test the integrated circuit memory device using the other of the first and second data path widths. Thus, testing efficiency may be increased by using fewer number of tester input/output pins.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 2:
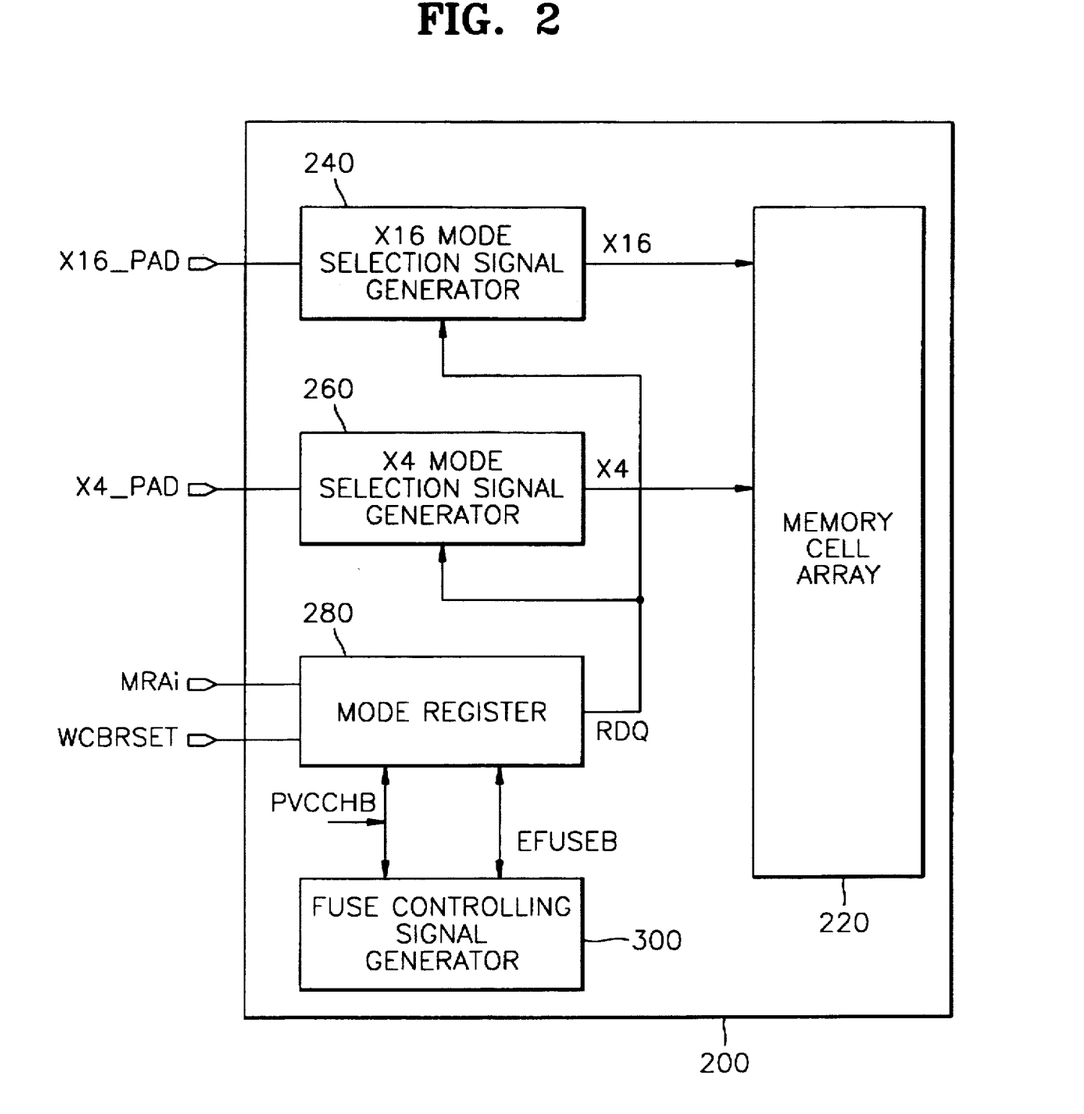
FIG. 2 is a block diagram of integrated circuit memory devices according to the present invention.

Referring now to FIG. 2, a block diagram of integrated circuit memory devices according to the present invention is now illustrated. As shown in FIG. 2, an integrated circuit memory device 200 includes an array of memory cells 220. The memory cell array 220 can operate one of a selectable first and second data path width. The first data path width is selected by first data path selection signal x16. The second data path width is selected by a second data path signal x4. The selection of data path widths for memory cell arrays of integrated circuit memory devices are well known to those having skill in the art and will not be described further herein.

Still referring to FIG. 2, a first data path width selection signal generator, shown as x16 mode selection signal generator 240, is responsive to a permanent first data path selection signal x16_PAD to generate the first data path selection signal x16. Similarly, the second data path selection signal generator, shown as x4 mode selection signal generator 260, is responsive to permanent selection of a second data path selection signal x4_PAD, to generate second data path width selection signal x4. An embodiment of x16 mode selection signal generator 240 and x4 mode selection signal generator 260 will be described in connection with FIGS. 3 and 4 respectively.

Still continuing with the description of FIG. 2, a mode register 280 is also provided. The mode register 280 is responsive to a mode register activation signal MRAi and to a control signal WCBRSET to generate a mode control signal RDQ. The mode control signal RDQ is applied to x16 mode selection signal generator 240 and to x4 mode selection signal generator 260. Thus, during testing, even though the integrated circuit has already been set to x16 mode or x4 mode by permanent application of a signal x16_PAD or x4_PAD, respectively, the permanent mode may be temporarily overridden by generating a mode control signal RDQ. In particular, when a logic high value is applied to the input signal MRAi, even if the x16 mode was selected during manufacturing and the memory device is an x16 product, it will temporarily operate in x4 mode. A detailed circuit embodiment of mode register 280 will be described in connection with FIG. 5.

Finally, still referring to FIG. 2, a fuse controlling signal generator 300 may also be provided. The fuse controlling signal generator may also allow the mode to be temporarily overridden by setting (opening or shorting) a fuse in fuse controlling signal generator 300. A detailed circuit embodiment of fuse controlling signal generator 300 will be described in connection with FIG. 6.

It will be understood that when the mode is temporarily overridden, the integrated circuit memory device 200 may then be tested using conventional methods, for example as an x4 device. After testing, the temporary signal MRAi is removed and the memory device continues to operate according to its permanent mode.

Figure 3:
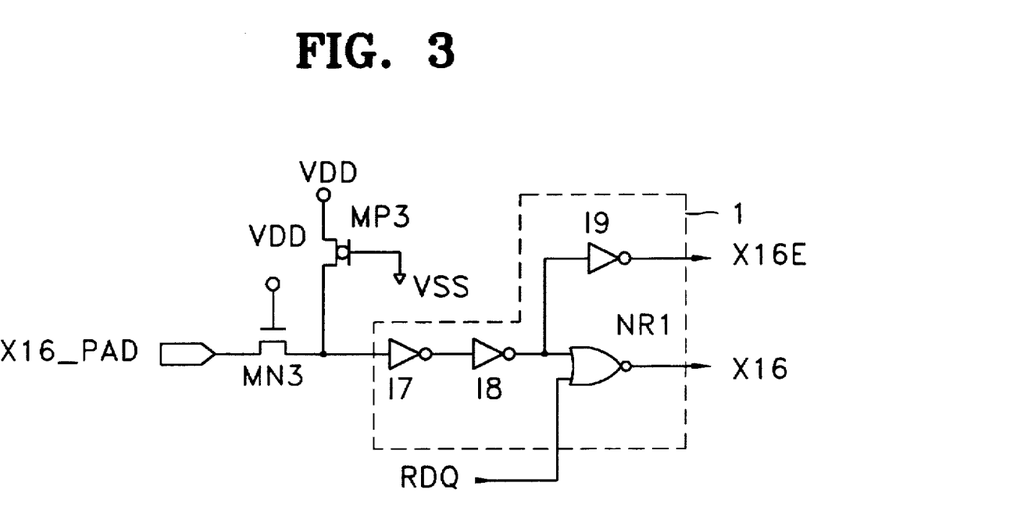
FIG. 3 is a circuit diagram of an x16 mode selection signal generator of FIG. 2.

FIG. 3 is a circuit diagram of an x16 mode selection signal generator 240 (FIG. 2) according to an embodiment of the present invention. The x16 mode select signal generator generates an x16 mode selection signal x16 in response to a bonding signal x16_PAD externally received via a bonding pad and a mode control signal RDQ, and selects the x16 mode of the semiconductor memory device.

Referring to FIG. 3, the x16 mode selection signal generator has an x16 bonding pad, a transferring circuit MN3 which transfers a bonding signal x16_PAD received from the x16 bonding pad, a pull-up circuit which pulls up an output terminal of the transferring circuit MN3, and logic circuit 1 which NANDs a signal of the output terminal of the transferring circuit MN3 with the mode control signal RDQ, and outputs an x16 mode selection signal.

The transferring circuit MN3 is an NMOS transistor which is always activated by applying a power supply voltage VDD to its gate. The pull-up circuit is a PMOS transistor having a source to which the power supply voltage VDD is applied, a gate to which ground voltage VSS is applied, and a drain connected to the output terminal of the transferring circuit MN3. The logic circuit 1 includes an inverter I7 which inverts a signal of the output terminal of the transferring circuit MN3, another inverter I8 which inverts an output signal of the inverter I7, a NOR gate NR1 which receives an output signal of the inverter I8 and the mode control signal RDQ and outputs the x16 mode selection signal x16, and a third inverter I9 which inverts the output signal of the inverter I8 and outputs another output signal x16E.

Figure 4:
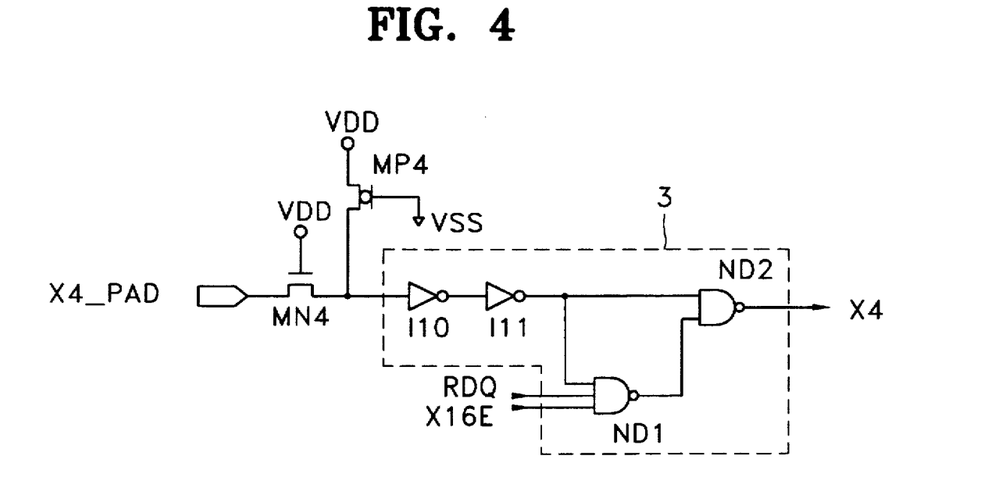
FIG. 4 is a circuit diagram of an x4 mode selection signal generator of FIG. 2.

FIG. 4 is a circuit diagram of an x4 mode selection signal generator 260 (FIG. 2) according to an embodiment of the present invention. The x4 mode select signal generator generates an x4 mode selection signal x4 in response to a bonding signal x4_PAD externally received from a bonding pad, the mode control signal RDQ, and the output signal x16E output from the x16 mode selection signal of FIG. 3, and selects an x4 mode of the memory device.

Referring to FIG. 4, the x4 mode selection signal generator has an x4 bonding pad, a transferring circuit MN4 which transfers a bonding signal x4-PAD received from the x4 bonding pad, a pull-up circuit MP4 which pulls up an output terminal of the transferring circuit MN4, and logic circuit 3 which ANDs the output signal x16E output from the x16 mode selection signal generator of FIG. 3 with the mode control signal RDQ, inverts a signal of the output terminal of the transferring circuit MN4, ORs each result, and outputting the x4 mode selection signal x4.

The transferring circuit MN4 is an NMOS transistor which is always activated by applying the power supply voltage VDD to its gate. The pull-up circuit MP4 is a PMOS transistor which has a source to which the power supply voltage VDD is applied, a gate to which ground voltage VSS is applied, and a drain connected to the output terminal of the transferring circuit MN4. The logic circuit 3 includes an inverter I10 which inverts a signal of the output terminal of the transferring circuit MN4, another inverter I11 which inverts an output signal of the inverter I10, a NAND gate ND1 which NANDs an output signal of the inverter I11, the mode control signal RDQ, and the output signal x16E, and another NAND gate ND2 which NANDs an output signal of the NAND gate ND1 with the output signal of the inverter I11, and outputs the x4 mode select signal x4.

Figure 5:
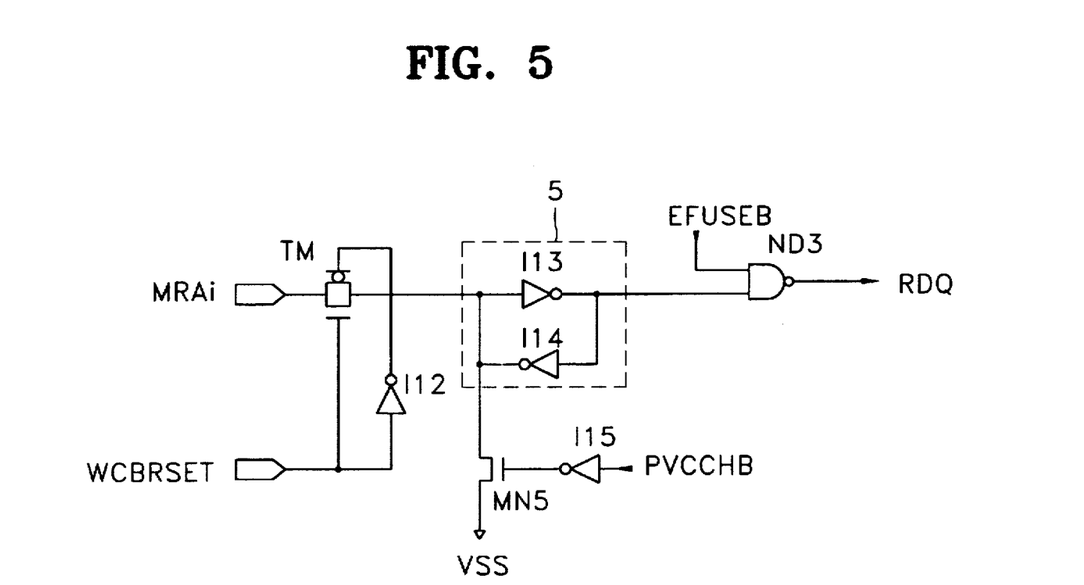
FIG. 5 is a circuit diagram of a mode register of FIG. 2.

FIG. 5 is a circuit diagram of a mode register 280 (FIG. 2) according to an embodiment of the present invention. The mode register receives an input signal MRAi in response to predetermined control signals WCBRSET and PVCCHB and a fuse controlling signal EFUSE, and generates the mode control signal RDQ.

Referring to FIG. 5, the mode register includes a transferring circuit TM which transfers the received input signal MRAi in response to the predetermined control signal WCBRSET, a latch 5 which stores the signal transferred from the transferring circuit TM, a logic circuit ND3 which NANDs an output signal of the latch 5 with the fuse controlling signal EFUSE, and outputs the mode control signal RDQ, and pull-down circuit MN5 which pulls down an input terminal of the latch 5 in response to the predetermined control signal PVCCHB.

The transferring circuit is a transmission gate which transmits the input signal MRAi to an output terminal when the predetermined control signal WCBRSET is at a high level. The latch 5 includes inverters I13 and I14. The logic circuit ND3 is a NAND gate, and the pull-down circuit MN5 is a PMOS transistor which has a drain connected to an input terminal of the inverter I13 of the latch 5, a gate to which the control signal PVCCHB is applied, and a source to which the ground voltage VSS is applied.

Figure 6:
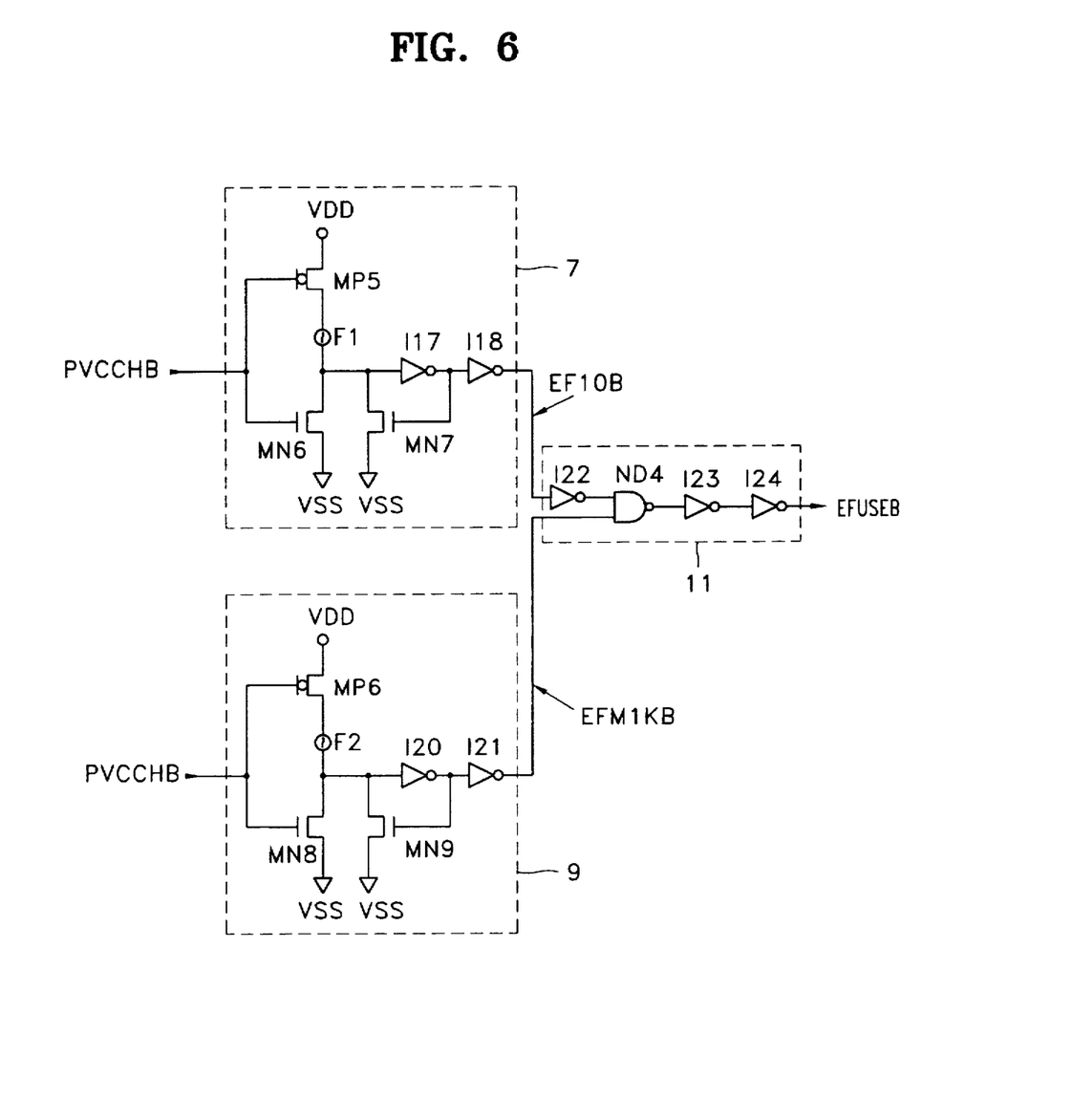
FIG. 6 is a circuit diagram of a fuse controlling signal generator according to FIG. 2.
Figure 7:
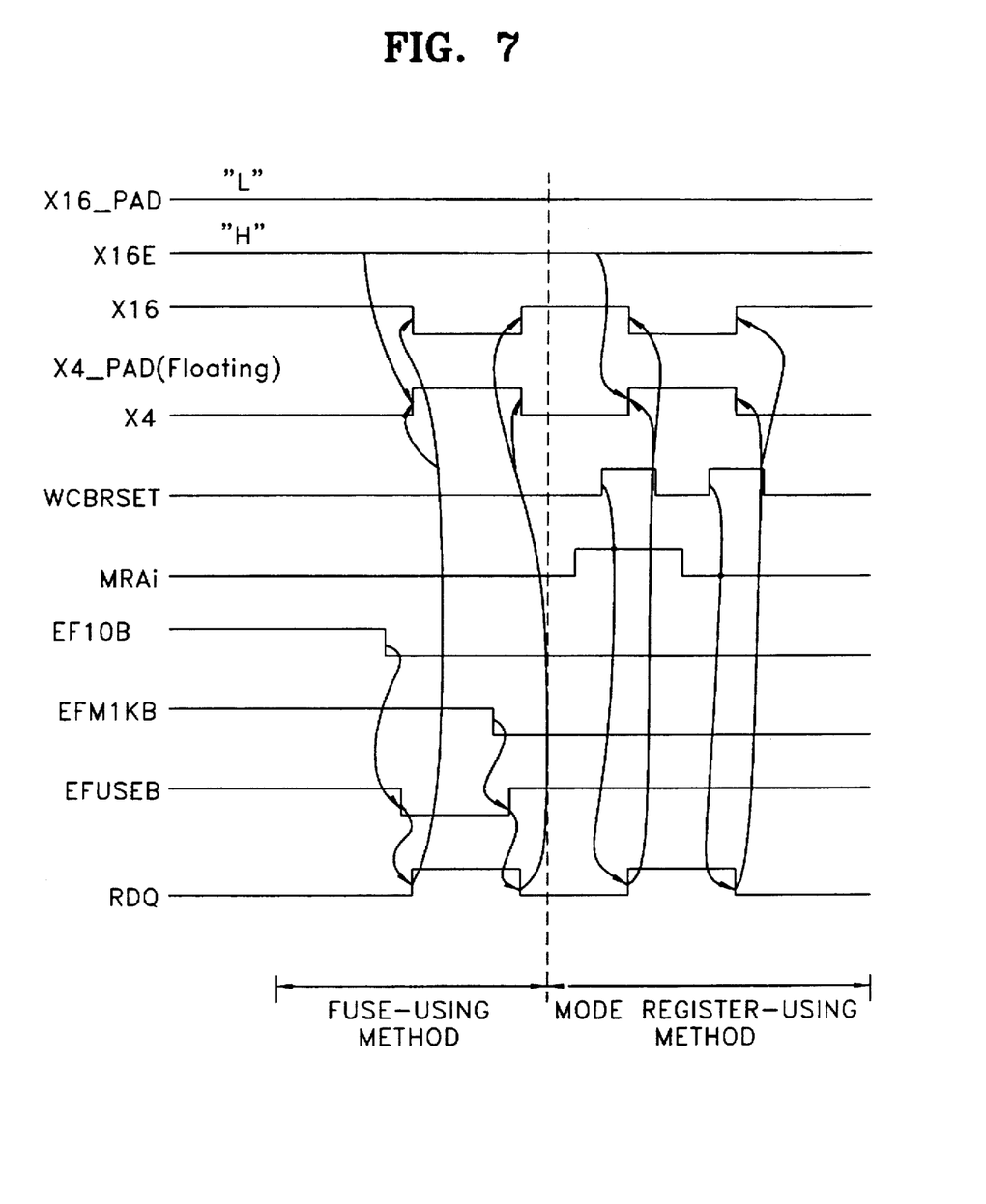
FIG. 7 is a timing diagram of signals for the circuits of FIGS. 2–6.

FIG. 7 is a timing diagram of the signals for the circuits shown in FIGS. 2 through 6. Referring to the timing diagram of FIG. 7, operation of the circuits shown in FIGS. 2, 3, 4, and 5, and methods for reducing the number of DQ channels in a semiconductor memory device by using a mode register will now be described.

First, the x16 bonding pad of FIG. 3 is bonded to the low level VSS, and the x4 bonding pad of FIG. 4 is floated. Thus, the output signal x16E of the inverter I9 shown in FIG. 3 is set to a high level, and the output signal of the inverter I11 shown in FIG. 4 is set to a high level.

Then, when the control signal PVCCHB, which is an initiating signal of the latch 5 shown in FIG. 5, is at a high level, the pull-down circuit MN5, namely, the NMOS transistor, is activated, thereby initiating the input terminal of the latch 5 at a low level. In addition, the mode control signal RDQ, which is the output of the NAND gate ND3, becomes low because the fuse controlling signal EFUSEB is generally kept high. Thus, the x16 mode select signal x16 of FIG. 3 becomes high, and the x4 mode select signal x4 of FIG. 4 becomes low, thereby selecting the x16 mode.

Thereafter, when the control signal WCBRSET of FIG. 5 is toggled from low to high and the input signal MRAi of the mode register is at a high level, a high level is stored in the latch 5, and the mode control signal RDQ becomes high. Hence, the x16 mode select signal x16 of FIG. 3 becomes low, and the x4 mode select signal x4 becomes high, thereby setting the semiconductor memory device operated in the x16 mode to the x4 mode.

Then, when the control signal WCBRSET is again toggled from high to low, and the input signal MRAi of the mode register is at a low level, the mode control signal RDQ becomes low. Thus, the x16 mode select signal x16 of FIG. 3 becomes high and the x4 mode select signal x4 of FIG. 4 becomes low, thereby setting the semiconductor memory device to the original mode, that is, the x16 mode.

Accordingly, a low level VSS-bonded state is temporarily overridden by using the mode register, thus reducing the number of DQ channels from 16 to 4. More memory devices can be tested in test equipment which has only a fixed number of DQ channels, thereby allowing an increase in testing efficiency.

Semiconductor memory devices according to the present invention, in which the number of DQ channels can be reduced by using a fuse, will now be described in detail. Referring again to FIG. 3, these embodiments of semiconductor memory devices of the present invention include a fuse controlling signal generator 300, a mode register 280, an x16 mode selection signal generator 240 for selecting a first organization mode, such as x16 mode, and an x4 mode selection signal generator 260 for selecting a second organization mode, such as x4 mode. Since the x16 and x4 mode select signal generators and the mode register are the same as those of FIGS. 3, 4, and 5, their description will not be repeated.

FIG. 6 is a circuit diagram of a fuse controlling signal generator 300 according to an embodiment of the present invention. The fuse controlling signal generator generates a fuse controlling signal EFUSEB in response to the states of first and second fuses F1 and F2.

Referring to FIG. 6, the fuse controlling signal generator has first fuse signal generator 7 which generates a first fuse signal EF1OB in response to a predetermined control signal PVCCHB and to the state of the first fuse F1, second fuse signal generator 9 which generates a second fuse signal EFM1KB in response to the predetermined signal PVCCHB and to the state of the second fuse F2, and logic circuit 11 which inverts the second fuse signal EFM1KB, ORs the inverted signal and the first fuse signal EF1OB, and outputs the fuse controlling signal EFUSEB.

The first fuse signal generator 7 includes a PMOS transistor MP5 which has a source to which the power supply voltage VDD is applied and a gate to which the control signal PVCCHB is applied. The first fuse F1 has a terminal connected to a drain of the PMOS transistor MP5. An NMOS transistor MN6 which has a drain connected to the other terminal of the first fuse F1, a source to which the ground voltage VSS is applied, and a gate to which the control signal PVCCHB is applied. Also included are an inverter I17 which inverts a signal output from the connection point of the first fuse F1 and the NMOS transistor MN6, an NMOS transistor MN7 which has a drain connected to the other terminal of the first fuse F1, a source to which the ground voltage VSS is applied, and a gate connected to an output terminal of the inverting means I17, and inverter I18 which inverts the output of the inverting means I17 and outputs the first fuse signal EF1OB.

The structure of the second fuse signal generator 9 is the same as that of the first fuse signal generator 7. The second fuse signal generator 9 includes a PMOS transistor MP6 which has a source to which the power supply voltage VDD is applied and a gate to which the control signal PVCCHB is applied. A second fuse F2 has a terminal connected to a drain of the PMOS transistor MP6. An NMOS transistor MN8 has a drain connected to the other terminal of the second fuse F2, a source to which the ground voltage VSS is applied, and a gate to which the control signal PVCCHB is applied. Also includes is an inverter I20 which inverts a signal output from the connection point of the second fuse F2 and the NMOS transistor MN8, an NMOS transistor MN9 which has a drain connected to the other terminal of the second fuse F2, a source to which the ground voltage VSS is applied, and a gate connected to an output terminal of the inverter I20, and inverter I21 which inverts the output of the inverter I20 and outputs the second fuse signal EFM1KB.

The logic circuit 11 includes an inverter I22 which inverts the first fuse signal EF1OP, a NAND gate ND4 which NANDs the received output signal of the inverter I22 and the second fuse signal EFM1KB, an inverter I23 which inverts an output signal of the NAND gate ND4, and another inverter I24 which inverts an output signal of the inverter I23.

Referring to the timing diagram of FIG. 7, operations of the circuits shown in FIGS. 2 through 6, and methods for reducing the number of DQ channels in a semiconductor memory device will be described. Similar to the method using a mode register, first, the x16 bonding pad of FIG. 3 is bonded to the low level VSS, and the x4 bonding pad of FIG. 4 is floated. Thus, the output signal x16E of the inverter I19 of FIG. 3 becomes high, and the output signal of the inverter I11 of FIG. 4 becomes high.

Then, when the latch 5 of FIG. 5 is initialized, the mode control signal RDQ, which is the output of the NAND gate ND3, becomes low, and thus the x16 mode select signal x16 of FIG. 3 becomes high, and the x4 mode select signal x4 becomes low, thereby selecting the x16 mode.

Then, when the first fuse F1 is disconnected, the first fuse signal EF1OB is set to a low level, thus setting the fuse controlling signal EFUSEB to a low level. With the first and second fuses F1 and F2 connected, the first fuse signal EF1OB and the second fuse signal EFM1KB are at a high level.

Therefore, the mode control signal RDQ, which is the output of the NAND gate ND3, becomes high. Thus, the x16 mode select signal x16 of FIG. 3 becomes low and the x4 mode select signal x4 of FIG. 4 becomes high, thereby setting the memory device from the x16 mode to the x4 mode.

When the second fuse F2 of FIG. 6 is disconnected, the second fuse signal EFM1KB becomes low, thus setting the fuse controlling signal EFUSEB to a high level. Here, since the latch 5 of FIG. 5 outputs a high level, which is initialized by means of the control signal PVCCHB, the mode control signal RDQ becomes low. Hence, the x16 mode select signal x16 of FIG. 3 becomes high and the x4 mode select signal x4 of FIG. 4 becomes low, thereby setting the semiconductor memory device operated in the x4 mode to the x16 mode.

As described above, therefore, the number of DQ channels can be temporarily reduced by using a fuse. Therefore, testing only 4 DQ channels need be used to test a memory device operated in the x16 mode. Thus, many memory devices can be simultaneously tested, thereby increasing testing efficiency.

In memory devices of which the number of DQ channels can be reduced by using a mode register or a fuse according to the present invention, the x16 mode is permanently set by bonding the x16 bonding pad to the low level VSS and floating the x4 bonding pad. Therefore, even though the number of DQ channels is fixed due to bonding of the x16 bonding pad, a signal is generated by using the mode register or fuse as if the x4 bonding pad is temporarily bonded. Thus, many memory devices can be tested simultaneously.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. An integrated circuit memory device comprising:
   an array of memory cells having a selectable one of first and second data path widths, such that the memory device can operate as a selectable one of an m bit by n memory device and an m/x bit by nx memory device; wherein x is an integer and
   a circuit which permanently selects one of the first and second data path widths for permanent operation of the integrated circuit memory device, such that the memory device permanently operates as one of an m bit by n memory device and an m/x bit by nx memory device, and which temporarily overrides the permanent selection of the one of the first and second data path widths, to thereby temporarily operate the memory using the other of the first and second data path widths, such that the memory device temporarily operates as the other of an m bit by n memory device and an m/x bit by nx memory device.

2. An integrated circuit memory device according to claim 1:
   wherein the circuit is activated during manufacture of the integrated circuit memory device to permanently select one of the first and second data path widths for operation of the integrated circuit memory device; and
   wherein the circuit is also activated during testing of the integrated circuit memory device to temporarily test the integrated circuit memory device using the other of the first and second data path widths.

3. An integrated circuit memory device according to claim 1:
   wherein the first path width is a sixteen bit path width and the second path width is a four bit path width;
   wherein the circuit is activated to permanently select the sixteen bit path width for operation of the integrated circuit memory device; and
   wherein the circuit temporarily overrides the sixteen bit path width to temporarily operate the memory with a four bit path width.

4. An integrated circuit memory device according to claim 2:
   wherein the first path width is a sixteen bit path width and the second path width is a four bit path width;
   wherein the circuit is activated to permanently select the sixteen bit path width during manufacture of the integrated circuit memory device to permanently operate the integrated circuit memory device with a sixteen bit path width; and
   wherein the circuit temporarily overrides the sixteen bit path width during testing of the integrated circuit memory device to test the integrated circuit memory device using the four bit path width.

5. An integrated circuit memory device according to claim 1 wherein the circuit comprises:
   a mode register which generates a mode control signal in response to an input signal;
   a first data path width selection signal generator, which is responsive to a permanent first data path selection signal, to permanently select the first data path width, and which is also responsive to the temporary override signal, to temporarily override selection of the first data path width; and
   a second data path width selection signal generator, which is responsive to a permanent second data path selection signal, to permanently select the second data path width, and which is also responsive to the temporary override signal, to temporarily override selection of the second data path width.

6. An integrated circuit memory device according to claim 5 wherein the mode register comprises:
   a first transfer circuit which transfers the input signal in response to a control signal;
   a latch which stores the transferred input signal; and
   a first logic circuit which generates the mode control signal from the transferred input signal.

7. An integrated circuit memory device according to claim 6 wherein the first data path width selection signal generator comprises:
   a first integrated circuit bonding pad;
   a second transfer circuit which transfers a permanent first data path width selection signal which is received from the first bonding pad; and
   a second logic circuit which combines the transferred first bonding signal and the mode control signal to permanently select the first data path width in response to the permanent first data path width selection signal unless the mode control signal temporarily overrides the permanent first data path width selection signal.

8. An integrated circuit memory device according to claim 7 wherein the second data path width selection signal generator comprises:
   a second integrated circuit bonding pad;
   a third transfer circuit which transfers a permanent second data path width selection signal which is received from the second bonding pad; and
   a third logic circuit which combines the transferred second bonding signal and the mode control signal to permanently select the second data path width in response to the permanent first data path width selection signal unless the mode control signal temporarily overrides the permanent second data path width selection signal.

9. An integrated circuit memory device according to claim 5 further comprising a fuse circuit including at least one fuse, wherein the mode register generates the mode control signal in response to an input signal and in response to the state of the at least one fuse.

10. An integrated circuit memory device according to claim 9 wherein the fuse circuit comprises:

a first fuse signal generator which generates a first fuse signal in response to the state of a first fuse;

a second fuse signal generator which generates a second fuse signal in response to the state of a second fuse; and a logic circuit which inverts the first fuse signal and logically combines the inverted first fuse signal and the second fuse signal to produce a fuse controlling signal.

11. A method of operating an integrated circuit memory device including an array of memory cells having a selectable one of first and second data path widths, such that the memory device can operate as a selectable one of an m bit by n memory device and an m/x bit by nx memory device, wherein x is an integer the method comprising the steps of:

permanently selecting one of the first and second data path widths for permanent operation of the integrated circuit memory device, such that the memory device permanently operates as one of an m bit by n memory device and an m/x bit by nx memory device; and temporarily overriding the permanent selection of the one of the first and second data path widths, to thereby temporarily operate the memory using the other of the first and second data path widths, such that the memory device temporarily operates as the other of an m bit by n memory device and an m/x bit by nx memory device.

12. A method according to claim 11:

wherein the step of permanently selecting is performed during manufacture of the integrated circuit memory device to permanently select one of the first and second data path widths for operation of the integrated circuit memory device; and wherein the step of temporarily overriding is performed during testing of the integrated circuit memory device to temporarily test the integrated circuit memory device using the other of the first and second data path widths.

13. A method according to claim 11:

wherein the first data path width is a sixteen bit path width and the second data path width is a four bit path width;

wherein the step of permanently selecting is performed during manufacture of the integrated circuit memory device to permanently select a sixteen bit path width for operation of the integrated circuit memory device; and wherein the step of temporarily overriding is performed during testing of the integrated circuit memory device to test the integrated circuit memory device using a four bit path width.

14. An integrated circuit memory device comprising:

an array of memory cells having a selectable one of first and second data path widths, such that the memory device can operate as a selectable one of an m bit by n memory device and an m/x bit by nx memory device; wherein x is an integer a mode register, which is responsive to an input signal and a control signal, to produce a mode control signal;

a first data path width mode selection signal generator, which is responsive to the mode control signal and to a first signal which is permanently applied thereto, and which selects the first data path width for the array of memory cells in response to the first signal, as long as the mode control signal is not produced by the mode register, such that the memory device permanently operates as one of an m bit by n memory device and an m/x bit by nx memory device; and a second data path width mode selection signal generator, which is responsive to the mode control signal and to a second signal which is permanently applied thereto, and which selects the second data path width for the array of memory cells in response to the second signal, as long as the mode control signal is not produced by the mode register, such that the memory device temporarily operates as the other of an m bit by n memory device and an m/x bit by nx memory device.

15. An integrated circuit memory device according to claim 14 wherein the second data path width mode selection signal generator is also responsive to selection of the first data path width by the first data path width mode selection signal generator, to prevent the second data path width mode selection signal generator from selecting the second data path width for the memory cell array.

16. An integrated circuit memory device according to claim 14 further comprising a fuse controlling signal generator circuit including at least one fuse, wherein the mode register generates the mode control signal in response to the input signal and the control signal, and in response to the state of the at least one fuse.

17. An integrated circuit memory device according to claim 16 wherein the fuse controlling signal generator circuit comprises:

a first fuse signal generator which generates a first fuse signal in response to the state of a first fuse;

a second fuse signal generator which generates a second fuse signal in response to the state of a second fuse; and a logic circuit which inverts the first fuse signal and logically combines the inverted first fuse signal and the second fuse signal to produce a fuse controlling signal.

18. An integrated circuit memory device according to claim 14 wherein the input signal and the control signal are activated during testing of the integrated circuit memory device, to produce the mode control signal.

* * * * *